(12) United States Patent
Rhode

(10) Patent No.: US 6,657,574 B1
(45) Date of Patent: Dec. 2, 2003

(54) ONE LINE DATA FORMAT FOR AUDIO ANALOG-TO-DIGITAL CONVERTERS

(75) Inventor: Jason Powell Rhode, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/314,555

(22) Filed: Dec. 9, 2002

(51) Int. Cl.[7] ............................................. H03M 1/12
(52) U.S. Cl. ...................................... 341/155; 341/141
(58) Field of Search ................................ 341/141, 155

(56) References Cited

U.S. PATENT DOCUMENTS

| | | | | | |
|---|---|---|---|---|---|
| 4,746,899 A | * | 5/1988 | Swanson et al. | ............ | 341/122 |
| 4,922,251 A | * | 5/1990 | Ollendick | ................... | 341/155 |
| 5,886,658 A | * | 3/1999 | Amar et al. | ................ | 341/155 |
| 6,147,631 A | * | 11/2000 | Maulik et al. | ............... | 341/122 |
| 6,201,492 B1 | * | 3/2001 | Amar et al. | ................ | 341/155 |
| 6,417,792 B1 | * | 7/2002 | King et al. | ................. | 341/143 |
| 6,456,219 B1 | * | 9/2002 | Schreiber et al. | ........... | 341/155 |
| 6,509,790 B1 | * | 1/2003 | Yang | .......................... | 327/554 |
| 6,522,274 B1 | * | 2/2003 | Amar et al. | ................ | 341/141 |

* cited by examiner

*Primary Examiner*—Michael Tokar
*Assistant Examiner*—Khai M. Nguyen
(74) *Attorney, Agent, or Firm*—James J. Murpny, Esq.; Winstead Sechrest & Minick

(57) ABSTRACT

An analog-to-digital converter is provided for converting multiple analog inputs into corresponding digital values. An output interface circuit uses differential signaling to reduce noise and interference induced in the analog portions of the analog-to-digital converter.

17 Claims, 4 Drawing Sheets

ONE LINE DATA FORMAT FOR AUDIO ANALOG-TO-DIGITAL CONVERTERS

FIELD OF INVENTION

The present invention relates in general to analog-to-digital converters, (ADCs) and, in particular, to methods and apparatuses for communicating high bit-rate data from an ADC to another device, such as a digital signal processor.

BACKGROUND OF INVENTION

Analog-to-digital converters convert analog signals into digital signals, enabling the signal to be manipulated and processed using numerical techniques. ADCs are utilized, for example, to convert an analog audio signal into a digital form so that digital processing techniques may be utilized to provide features, such as volume control, frequency equalization, encryption, filtering, surround sound decoding, and ambiance effects. Additionally, digital signals are suitable for recording or transmitting to another location with no loss in signal quality.

Typically, an ADC converts an analog signal into digital words representing the amplitude of the audio signal at fixed intervals determined by the sampling rate or frequency. The data words are then transmitted to a digital signal processor (DSP), which manipulates the data words to provide various desired features. The ADC may transmit the digital words in a parallel format, e.g. eight or sixteen bits at a time; however, commodity DSPs often provide circuitry for receiving data serially, e.g., one bit at a time. Accordingly, integrated circuit ADCs often provide the digital data words in a compatible serial format.

In mixed signal integrated circuits, switching transients in the digital circuitry are known to create considerable noise and interference in the analog circuits. In an ADC, the noise may taint the accuracy or reduce the audible signal to noise ratio of the device. Because of the rapid switching involved, the actual transmission of data on the serial data (SDATA) line is a major source of noise and interference for sensitive analog circuitry within an ADC. One method to minimize such noise and interference, is to have the switching activity occur at specific times relative to noise sensitive operations. Previously, this has been accomplished by re-timing the operation of various circuits within the ADC as is described in U.S. Pat. No. 4,746,899, which is incorporated herein in its entirety. Retiming the serial transmission requires the master clock (MCLK) frequency be at least twice serial clock (SCLK).

In conventional stereo audio systems, a pair of audio channels are converted into digital form. Typically, a stereo ADC, having a pair of ADCs in a single integrated circuit package, is utilized to convert stereo audio into a digital form. A serial clock (SCLK) signal synchronizes the transmission and reception of each bit, and a channel clock (LRCK) signal differentiates between the left and right channels of data which are alternately transmitted. A master clock (MCLK) controls the internal operation of the ADC and DSP. Stereo audio uses a pair of audio channels, which provide a left channel and a right channel of audio; however, newer audio formats use more than two audio channels to provide a richer audio experience. For example, 5.1 channel audio, which is found on some DVD movie soundtracks, is utilized to create up to six channels of audio: a center front channel, left and right front channels, left and right surround channels, and a subwoofer channel. Digital audio formats capable of providing seven, eight, or more audio channels have also been developed.

For such high channel-count audio systems, the frequencies required to retime serial channel operation become more difficult, particularly at high sample rates. For example, an 8-channel system with 24-bit samples and a 192 kHz sample rate requires an SCLK frequency of about 36.8 MHz and a corresponding MCLK greater than about 73.7 MHz. Circuits using such high clock frequencies are difficult to design and use and, therefore, are not practical nor desirable. High bit rates also exacerbate the noise and interference problems in the analog portion of an ADC.

It would, therefore, be desirable to provide methods and apparatuses for serially transmitting digital audio signals with a high channel count and a high bit-rate without re-timing.

It would also be desirable to provide methods and apparatuses for serially transmitting digital audio signals with a high channel count and a high bit-rate while minimizing noise and interference.

It would also be desirable to provide methods and apparatuses for serially transmitting digital audio signals with a high channel count and a high bit-rate without the need for an excessively high master clock frequency.

SUMMARY OF INVENTION

Methods and apparatuses are provided for serially transmitting audio signals with a high-channel count and a high bit-rate without re-timing and without the need for an excessively high master clock frequency, while minimizing noise and interference.

A high bit-rate ADC with a serial interface for transmitting digital data words to another device is provided. In one embodiment, the ADC is a multi-channel ADC, and the serial interface uses a plurality of pins to serially transmit the digital data words. Each pin is utilized to transmit a different set of data channels so that multiple channels are concurrently transmitted. In a second embodiment of the multi-channel ADC, the serial interface is configured to transmit the data from all of the analog channels over a single serial data path, preferably using differential signaling. Multi-channel audio ADCs incorporating the principles of the present invention are able to transfer digital data at high bit rates without requiring excessive clock frequencies, while minimizing noise and interference to the analog circuitry.

BRIEF DESCRIPTION OF DRAWINGS

For a more complete understanding of the present invention, and the advantages thereof, reference is now made to the following descriptions taken in conjunction with the accompanying drawings, in which like numbers designate like parts throughout, and in which.

DETAILED DESCRIPTION OF THE INVENTION

The principles of the present invention and their advantages are best understood by referring to the illustrated embodiment depicted in FIGS. 1–6 of the drawings, in which like numbers designate like parts.

Figure 1:
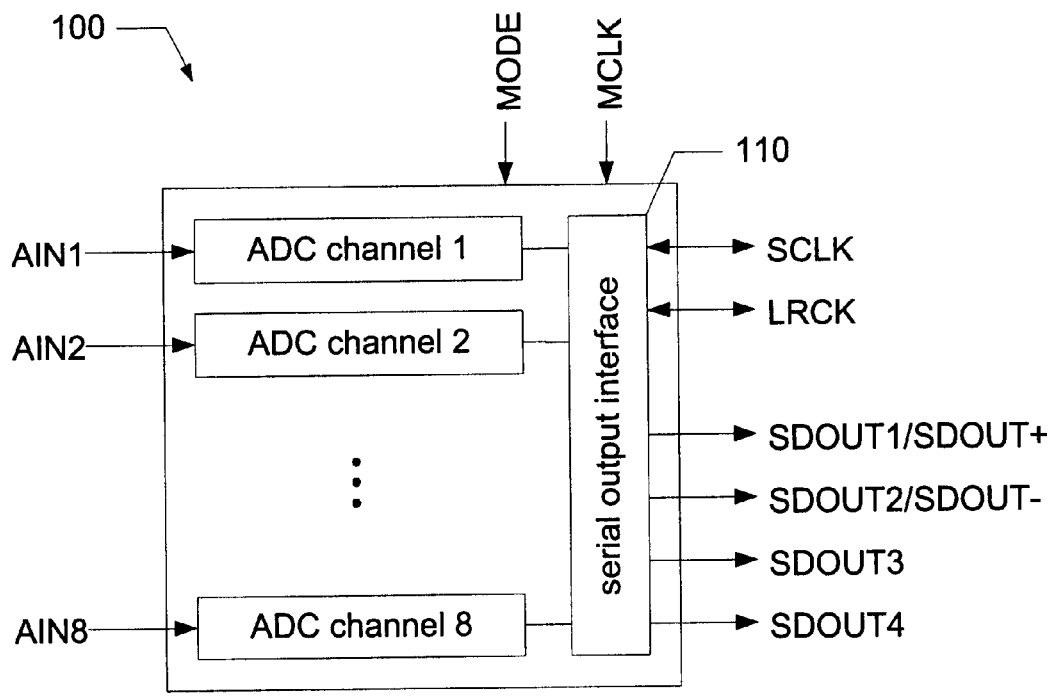
FIG. 1 is a schematic block diagram of an illustrative multi-channel ADC in accordance with the principles of the present invention.

FIG. 1 is a high level operational block diagram of a single-chip, multi-channel audio analog-to-digital converter (ADC) 100 in accordance with the principles of the present invention. Multi-channel ADC 100 includes ADC channels 1 to 8, which receive analog audio signals AIN1–AIN8 and convert them into corresponding digital signals, which are sent to serial output interface 110. Serial output interface 110 organizes the eight digital signals and transmits them to another device, such as a microprocessor or digital signal processor (DSP), using data lines SDOUT1-SDOUT4, serial clock SCLK, and left-right channel clock LRCK. Master clock MCLK is utilized to control and synchronize the operation of multi-channel ADC 100. Additional inputs may be provided for power and ground connections, voltage references, discrete electronic components, mode configuration, and the like; however, for clarity, these connections are omitted from FIG. 1.

Figure 2:
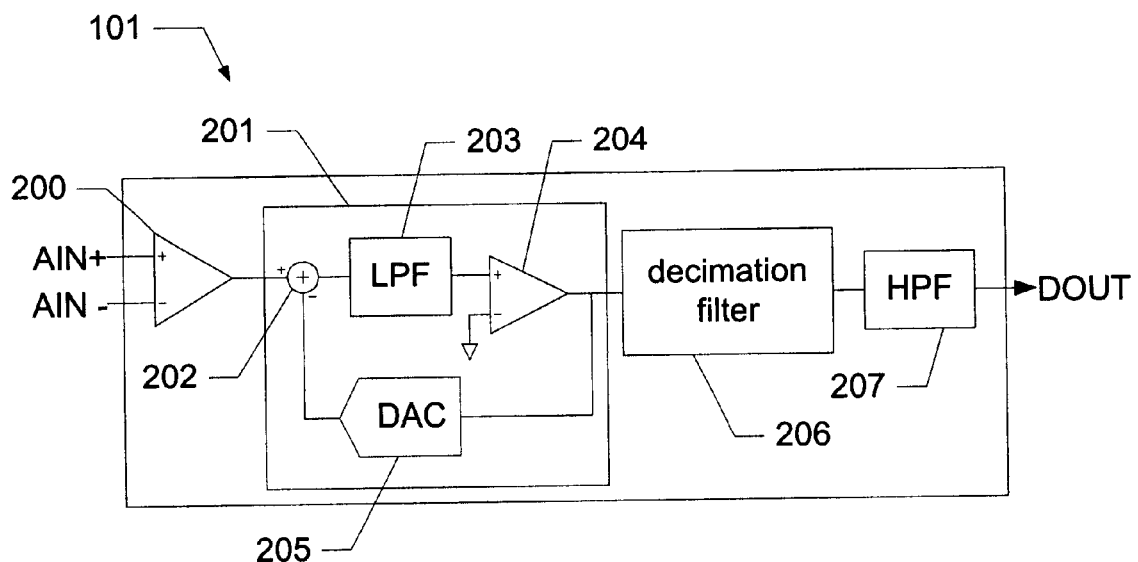
FIG. 2 is a block diagram of a single ADC channel of FIG. 1.
Figure 3:
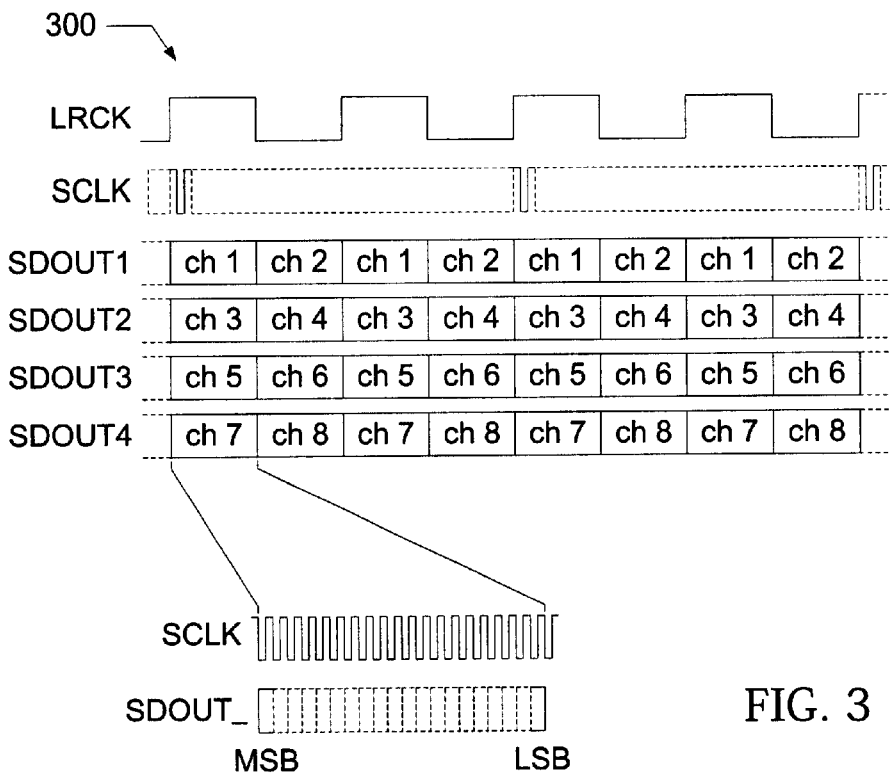
FIG. 3 is an illustrative timing diagram of signals used to communicate data in a first mode of operation of the present invention.

Referring now to FIG. 2, an analog signal is connected to differential inputs AIN+ and AIN− to gain stage 200 of illustrative ADC channel 1. The amplified signal is then passed to delta-sigma modulator 201, which includes summer 202, low pass filter (LPF) 203, comparator (quantizer) 204, and digital to analog converter (DAC) 205 in the feed back loop. In an alternative embodiment, gain stage 200 is omitted, and the input(s) is connected directly to delta-sigma modulator 201. The outputs of the delta-sigma modulator are passed through decimation filter 206, which reduces the oversampling rate, and then through high pass filter (HPF) 207, which attenuates any out-of-band noise. The output of ADC channel 1 is a digital word or sample, typically 16 to 24-bits in length, representative of the amplitude of the analog signal at a discrete time. The digital samples are obtained at fixed intervals determined by the sample rate or sample frequency ($F_s$), which is typically in a range of about 40 kHz to about 200 kHz.

Referring back to FIG. 1, the outputs of ADC channels 1 to 8 are provided to serial output interface 110. Serial output interface 110 accepts the digital sample data from the ADC channels, organizes the data according to the selected mode of operation of multi-channel ADC 100, and serially transmits the data samples over serial data output pins SDOUT1 to SDOUT4. As described above, the presence of multiple data channels requires the data to be transmitted at a high bit rate. In a first mode of operation, the data channels are organized as four stereo pairs of data, which are then transmitted over the four output pins, each pin alternating between two channels of data. For example, data words from ADC channel 1 are transmitted through pin SDOUT1, alternating with data words from ADC channel 2, as shown in timing diagram 300 of FIG. 3. Similarly, ADC channels 3 and 4 are transmitted through pin SDOUT2; ADC channels 5 and 6 are transmitted through pin SDOUT3, and ADC channels 7 and 8 are transmitted through pin SDOUT4. The channels sharing an output data line are differentiated by the status of clock LRCK. For example, when the signal for clock LRCK is high, the odd channel in each pair is being transmitted whereas, the even channel in each pair is transmitted when the signal for clock LRCK is low.

Figure 4:
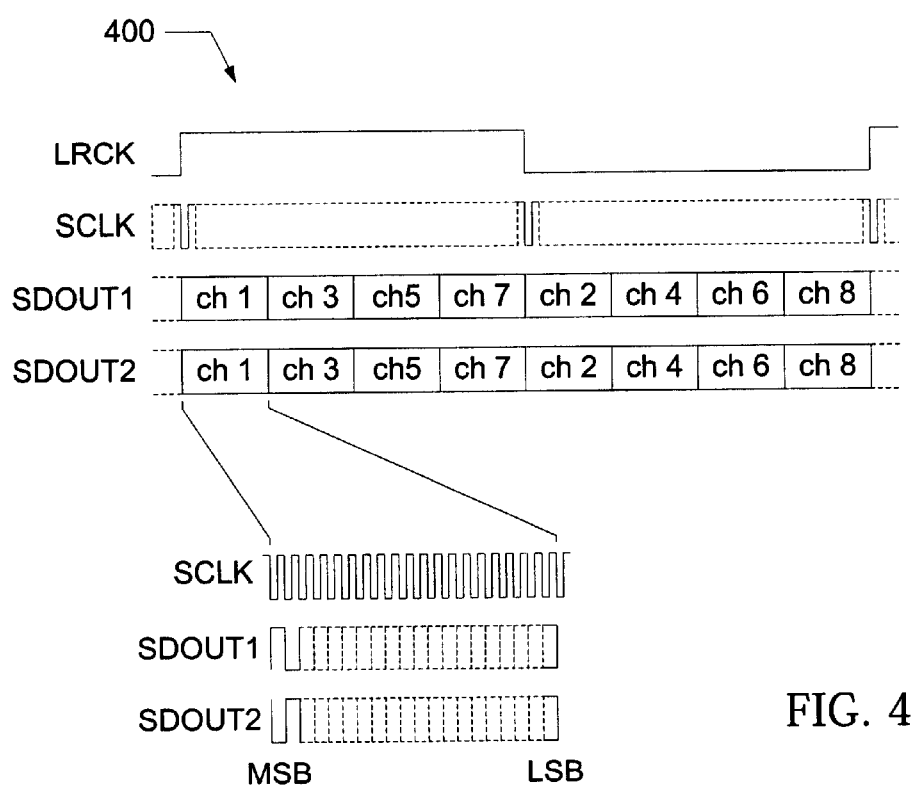
FIG. 4 is an illustrative timing diagram of signals used to communicate data in a second mode of operation.

Typically, the signals on SDOUT1–4 are single-ended signals in which the logical value of a signal is determined by the voltage of the signal with respect to a circuit ground. In another mode of operation all of the digital channels are serially transmitted over a single communication path using differential signals in which the logical value of a signal is determined by the relative voltage of a pair of signals. For example, eight ADC channels are transmitted over SDOUT1 in the following order: channel 1, 3, 5, and 7 followed by channels 2, 4, 6, and 8. However, other channel orderings are also possible. As in the first mode of operation described above, clock LRCK is utilized to identify the channel being transmitted. FIG. 4 shows this use of clock LRCK in illustrative timing diagram 400. Clock LRCK is high for the odd numbered ADC channels and low for the even numbered channels. Thus, the data for ADC channel 1 follows a low-to-high transition clock on LRCK, and the data for ADC-channel 2 follows a high-to-low transition on clock LRCK. Because each channel has a know word size, the position of the remaining channels of data are determined by counting bit positions as shown in the inset in FIG. 4. Alternatively, LRCK is high for ADC channel 1 and low for all the other channels.

When this mode of operation is used, pins SDOUT1 and SDOUT2 are used together to create differential signals. In other words, the signal transmitted from pin SDOUT2 is the logical complement of the signal from pin SDOUT1, e.g., pin SDOUT2 is low when pin SDOUT1 is high, as shown in the inset of FIG. 4. Using this technique, the value of a data bit is determined by the level at pin SDOUT1 relative to the level at pin SDOUT2. When the level at pin SDOUT 1 is higher than the level at pin SDOUT2, the data bit is a '1'; conversely, when the level at pin SDOUT1 is lower than the level at pin SDOUT2, the data bit is a logical '0'. Differential transmission enables higher transmission speed and also reduces noise and interference coupled from the output signal lines to sensitive analog circuitry within the ADC. This is because noise from the positive and negative signals couple equally to the analog circuits and tend to cancel each other.

Figure 5:
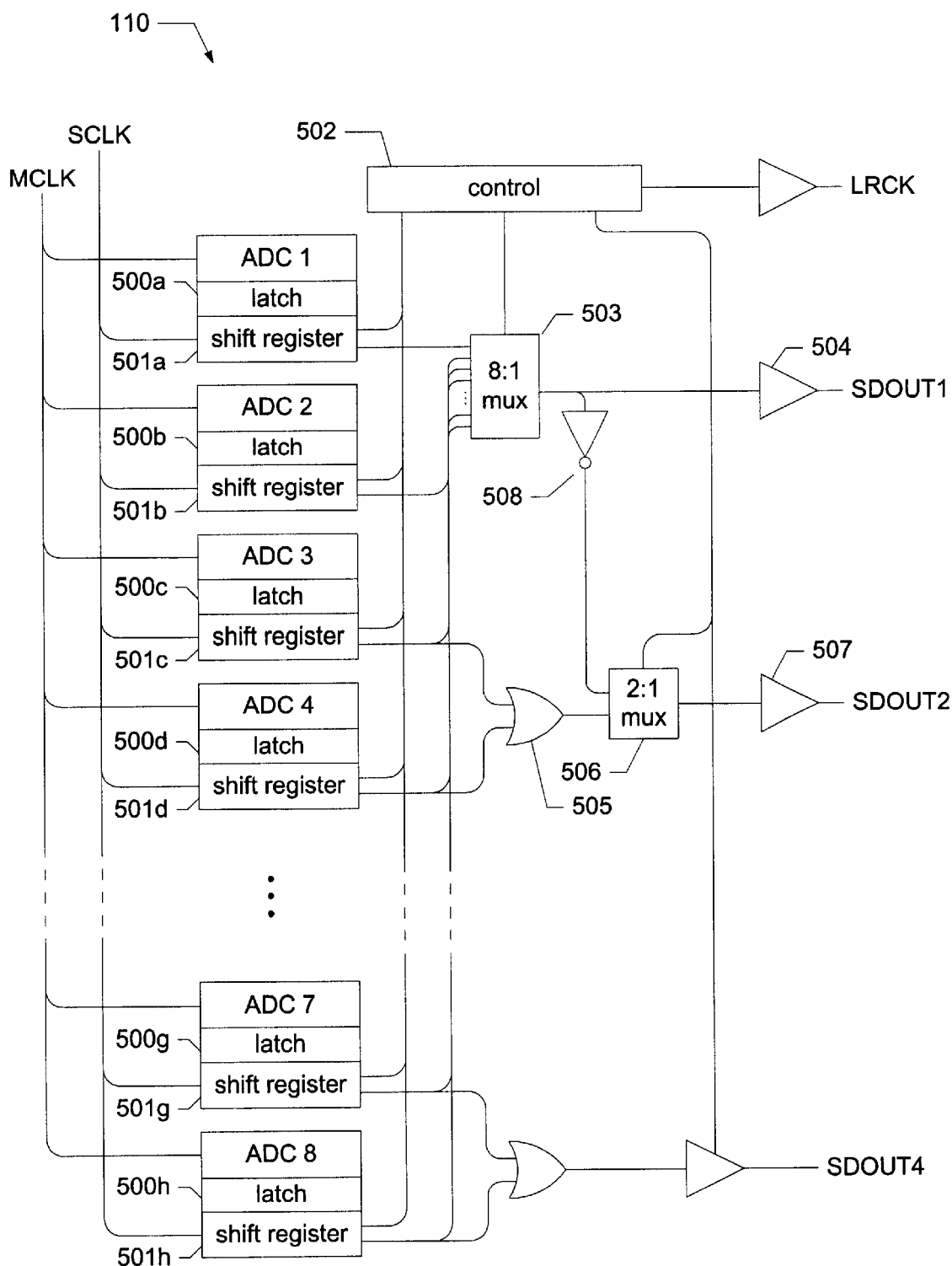
FIG. 5 is a simplified block diagram of the illustrative circuitry implementing the serial output interface of FIG. 1.

Illustrative circuitry implementing serial output interface 110 is shown in FIG. 5. Serial output circuitry 110 includes latches 500a–500h and corresponding shift registers 501a–h. ADC channels 1 to 8 convert their respective analog input signals into digital data words, and are synchronized by clock MCLK. Upon completion of an analog-to-digital conversion, the data words are transferred to corresponding latches 500a–500h, which serve to double buffer the data until shift registers 501a–501h are empty. When shift registers 501a–501h become available, the shift registers are loaded with the data words from corresponding latches 500a–500h.

The data words are then serially shifted from the shift registers and sent to outputs pins SDOUT1 to SDOUT4 as determined by control circuit 502 according to the selected mode of operation. In a first mode of operation, data words from a pair of ADC channels are transmitted alternately on an output as described above with reference to FIG. 3. In this mode of operation, control circuit 502 first enables shift registers corresponding to odd numbered ADC channels, e.g., shift registers 501a, 501c, 501e and 501g. Control circuit 502 also selects the input corresponding to ADC channel 1 on 8:1 multiplexer (MUX) 503, selects the input corresponding to OR gate 505 on 2:1 mux 506, and drives clock LRCK high to indicate the odd numbered channels are being transmitted. On each cycle of serial clock SCLK, a bit is shifted out of the enabled shift registers and routed to the appropriate output. For example, a bit shifted out of shift register 501a is sent to output pin SDOUT1 via 8:1 mux 503 and output driver 504. At the same time, a data bit corresponding to ADC channel 3 from register 501c is sent to OR gate 505. Because the output of shift register 501d is not enabled by control circuit 502, its output does not affect OR gate 505, and only data from shift register 501c is sent to 2:1 mux 506 and then to output driver 507. Data from ADC channels 5 to 8 are similarly sent to outputs pins SDOUT3 (not shown in FIG. 5) and SDOUT 4.

After data from the odd numbered ADC channels has been sent, control circuit 502 disables the outputs of the previously enabled shift registers and enables the outputs of the shift registers corresponding to the even numbered ADC channels, i.e., shift registers 501b, 501d, 501f, and 501h. Control circuit 502 also causes 8:1 mux 503 to select the input corresponding to shift register 501b and drives the signal for LRCK clock low. On each cycle of serial clock SCLK, a bit is shifted out of the enabled shift registers to corresponding outputs pins SDOUT1-SDOUT4 in a manner analogous to that described above.

In a second mode of operation, data from all of the ADC channels is serially transmitted over a single communication link using differential signals as described in connection with FIG. 4. In this mode, control circuit 502 first enables shift register 501a corresponding to ADC channel 1; and disables all other shift registers. Clock LRCK is driven high, and 8:1 mux is configured to select the input connected to shift register 501a. Control circuit 502 also disables any unused output drivers, e.g., output driver 509. On each cycle of serial clock SLCK, a bit is shifted from shift register 501a and routed through 8:1 mux 503 and output driver 504 to output SDOUT1.

After an entire data word has been shifted from shift register 501a, shift register 501a is disabled, and shift register 501c is enabled. 8:1 multiplexer 503 is also reconfigured to select its input from shift register 501c. This re-configuration provides a path for data bits to be shifted from shift register 501c, which corresponds to ADC channel 3. Control circuit 502 continues to selectively enable shift registers 501a–501h one at a time, in the desired order, and configures 8:1 mux 503 appropriately so that the data from ADC channels 1–8 are serially transmitted to output pin SDOUT1 in the order shown in FIG. 4. Alternative arrangements of the data words are possible, and in an illustrative embodiment of the present invention, control circuit 502 is configurable to send the data in any desired sequence. After all eight channels have been transmitted, new data is loaded into shift registers 501a–501h from corresponding latches 500a–500h, and the process is re-started.

In the second mode of operation, the data is transmitted using differential signaling by also routing the output of 8:1 mux 503 to output driver 507 through inverter 508 and 2:1 mux 506, which is configured to select its input from inverter 508. The output of output driver 507 is then the inverse of the output of output driver 504. When the signal at pin SDOUT1 is high, the signal at pin SDOUT2 is low, and when the signal at pin SDOUT1 is low, the signal at pin SDOUT2 is high. Differential signaling advantageously minimizes noise coupling to sensitive analog circuitry within ADC 100.

Figure 6:
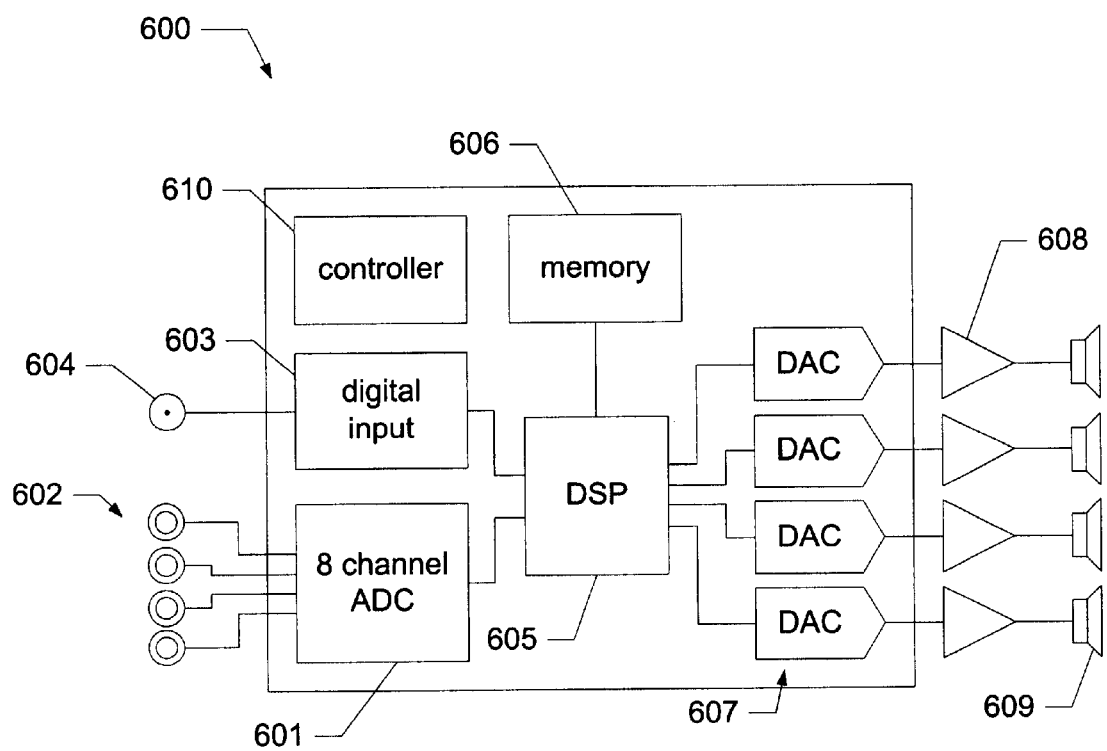
FIG. 6 is a simplified block diagram of an exemplary audio processor receiver using a multi-channel ADC constructed in accordance with the principles of the present invention.

Referring now to FIG. 6, an exemplary audio processor is described that incorporates a multi-channel ADC according to the principles of the present invention disclosed herein. Audio processor 600 includes eight channel ADC 601, which receives four analog stereo inputs on input jacks 602. Illustratively, the analog stereo signals correspond to eight channels in a 7.1 channel format. ADC 601 converts the analog signals to corresponding digital signals. Typically, audio processor 600 also includes digital input circuitry 603 that receives digital signals from input connector 604, e.g., a Sony/Philips Digital Interface (S/PDIF) optical or coaxial connector.

The digital signals, from ADC 601 or digital input 603, are sent to DSP 605 for processing. Memory 606 stores programs and data used by DSP 605 to implement the features and operations to be provided by audio processor 600. For example, programs and data to implement time delay and reverberation effects are utilized to selectively recreate the acoustic ambiance of a concert hall or night club. The processed data are then sent to DACs 607 for conversion to analog stereo signals to be reproduced by amplifiers 608 and speakers 609. Controller 610 orchestrates the operation of audio processor 600 and provides additional operations such as an user interface.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. It is therefore contemplated that the claims will cover any such modifications or embodiments that fall within the true scope of the invention.

What is claimed is:

1. An integrated circuit for an analog-to-digital converter, the integrated circuit, comprising:

analog-to-digital converter circuitry including circuitry for converting a plurality of analog input signals to a corresponding plurality of digital signals; and output interface circuitry for transmitting the digital signals to another device, the output interface circuitry including a plurality of serial ports;

wherein the output interface circuitry includes first circuitry to transmit the digital signals over the plurality of serial ports using single-ended signaling, second circuitry to transmit the digital signals over pairs of the serial ports using differential signaling; and wherein the integrated circuit is configurable to selectably use either the first circuitry or the second circuitry.

2. The integrated circuit of claim 1 wherein the output interface circuitry further comprises circuitry to transmit the digital signals as a bit stream over a first one of the plurality of serial ports and to transmit the bit-by-bit inversion of the bit stream over a second one of the plurality of serial ports.

3. The analog-to-digital converter integrated circuit of claim 1, wherein the output interface circuitry further comprises circuitry to transmit a first subset of the plurality of digital signals over the first serial port and to transmit a second subset of the plurality of digital signals over a second one of the serial ports.

4. The analog-to-digital converter integrated circuit of claim 3, wherein all of the digital signals are transmitted over a single one of the plurality of serial ports by interleaving the digital values of the digital signals.

5. The analog-to-digital converter integrated circuit of claim 4, wherein the digital values are transmitted over a first one of the plurality of serial ports and the complement of the digital values is transmitted over a second one of the plurality of serial ports.

6. The integrated circuit of claim 1, wherein:
the analog-to-digital converter circuitry includes circuitry for converting eight analog signals into eight corresponding digital signals; and
the output interface circuitry includes four serial ports, wherein the output interface circuitry is configurable to transmit the eight digital signals over the four serial ports according to one of two modes of operation comprising:
a first mode wherein the output interface circuitry transmits a first pair of the eight digital signals on the first serial port, transmits a second pair of the eight digital signals on the second serial port, transmits a third pair of the eight digital signals on the third serial port, transmits a fourth pair of the eight digital signals on the fourth serial port; and
a second mode wherein the output interface circuitry transmits the first through eighth digital signals over a single one of the first through fourth serial ports.

7. The integrated circuit of claim 6, wherein the first through eighth digital signals are transmitted over the first and second serial ports such that when a bit is transmitted over the first serial port, the logical compliment of the bit is transmitted over the second serial port.

8. The integrated circuit of claim 6, wherein the output interface circuitry is further configurable to transmit in a third mode in which the output interface circuitry transmits the eight digital signals over a first one of the four serial ports and transmits the per bit inverse of the digital signals over a second one of the four serial ports.

9. A method of providing a plurality of digital signals corresponding to a plurality of analog signals, the method comprising:
determining a device configuration;
converting amplitudes of the plurality of analog signals into a corresponding plurality of digital values;
transmitting the digital values over a plurality of communications links, wherein single-ended signaling is used responsive to a determination that the device is in a first configuration and differential signaling is used responsive to a determination that the device is in a second configuration.

10. The method of claim 9, wherein converting amplitudes of the plurality of analog signals into a corresponding plurality of digital values comprises converting first and second analog signals into corresponding first and second digital values; and wherein transmitting the digital values over a communications link comprises transmitting the first and second digital values over respective first and second ones of the plurality of communications links.

11. The method of claim 9, wherein converting amplitudes of the plurality of analog signals into a corresponding plurality of digital values comprises converting first and second analog signals into corresponding first and second digital values and wherein transmitting the digital values over a communications link comprises transmitting the first and second digital values in sequence over a first one of the plurality of communications links.

12. The method of claim 11, wherein the logical complement of the first and second digital values are transmitted in sequence over a second one of the plurality of communications links.

13. The method of claim 9, wherein determining a device configuration comprises determining whether a configuration pin is biased to a predetermined level.

14. The method of claim 13, wherein the configuration pin comprises a pin used for one of the plurality of serial communication links.

15. A method of reducing deleterious effects of electrical noise coupled into analog circuitry of an integrated circuit analog to digital converter, the method comprising:
providing a serial output interface including
first circuitry for transmitting a signal on a first pin of the integrated circuit; and
second circuitry for transmitting a signal on a second pin of the integrated circuit, wherein the second circuitry is configurable to selectably transmit on the second pin a signal that is the inverse of a signal transmitted on the first pin;
sampling an analog signal, to obtain a corresponding digital value;
transmitting the digital value on the first pin of the analog-to-digital converter integrated Circuit; and
configuring the serial output interface so that the inverse of the digital value is transmitted on a second pin of the analog-to-digital converter integrated circuit, so that when a Pit is transmitted on the first pin the inverse of the bit is transmitted on the second pin.

16. The method of claim 15, wherein sampling the analog signal comprises sampling a plurality of signals to obtain a corresponding plurality of digital values, Wherein transmitting the digital value comprises transmitting the plurality of digital values; and wherein transmitting the bit-wise inverse of the digital value comprises transmitting the bit-wise inverse of the plurality of digital values.

17. The method of claim 16, wherein the order in which the plurality of digital values is transmitted is configurable.

* * * * *